United States Patent
Wang et al.

(10) Patent No.: US 12,044,721 B2
(45) Date of Patent: Jul. 23, 2024

(54) SCAN CHAIN DESIGNING AND CIRCUIT TESTING METHOD

(71) Applicant: REALTEK SEMICONDUCTOR CORPORATION, Hsinchu (TW)

(72) Inventors: Shiou Wen Wang, Hsinchu (TW); Yu Yen Yang, Hsinchu (TW); Ying-Yen Chen, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 155 days.

(21) Appl. No.: 18/049,521

(22) Filed: Oct. 25, 2022

(65) Prior Publication Data

US 2023/0213575 A1  Jul. 6, 2023

(30) Foreign Application Priority Data

Jan. 4, 2022 (TW) .................................. 111100210

(51) Int. Cl.
*G01R 31/28* (2006.01)
(52) U.S. Cl.
CPC ................................ *G01R 31/2834* (2013.01)
(58) Field of Classification Search
CPC .................................................. G01R 31/2834
See application file for complete search history.

(56) References Cited

U.S. PATENT DOCUMENTS

| 10,796,043 B1 * | 10/2020 | Huang ................... G06F 30/333 |
| 2005/0081130 A1 | 4/2005 | Rinderknecht et al. |
| 2020/0285791 A1 * | 9/2020 | Lo ........................ G06F 30/3308 |
| 2020/0311218 A1 * | 10/2020 | Tsai ..................... G06F 30/3312 |

FOREIGN PATENT DOCUMENTS

| CN | 105115441 A | 12/2015 |
| CN | 108972554 A | 12/2018 |
| CN | 112154336 A | 12/2020 |
| TW | 201017193 A | 5/2010 |

OTHER PUBLICATIONS

Rieger, R., Taylor, J. T. (2009). An adaptive sampling system for sensor nodes in body area networks. IEEE Transactions on Neural Systems and Rehabilitation Engineering, 17(2), 183-189. https://doi.org/10.1109/tnsre.2008.2008648.
English abstract translation of TW201017193A, CN105115441A, CN108972554A and CN112154336A.

* cited by examiner

*Primary Examiner* — Jermele M Hollington
*Assistant Examiner* — Zannatul Ferdous
(74) *Attorney, Agent, or Firm* — WPAT, P.C.; Anthony King

(57) ABSTRACT

A scan chain designing method includes: obtaining test points according to a gate-level netlist; determining integers M and N, wherein M and N are no greater than an amount X of the test points; selecting M and N test points to be a first and second set test points according to a priority; obtaining a first test coverage and a first test pattern count according to the first set test points and obtaining a second test coverage and a second test pattern count according to the second set test points; obtaining a predicted test coverage curve according to the first and second test coverages; determining an optimum amount O according to the predicted test coverage curve, the first and second test pattern counts, wherein O is no greater than X; and selecting O test points to arrange a scan chain according to the priority and the optimum amount O.

20 Claims, 5 Drawing Sheets

SCAN CHAIN DESIGNING AND CIRCUIT TESTING METHOD

CROSS-REFERENCE TO RELATED APPLICATIONS

This application claims the benefit of priority to patent application Ser. No. 11/100,210, filed in Taiwan on Jan. 4, 2022, which is incorporated by reference in its entirety.

TECHNICAL FIELD

The present application relates to a testing method, particularly to a scan chain designing and testing method.

BACKGROUND

In the circuit test using a scan chain, the test point setting in the scan chain is related to the test performance. If a test point with poor efficiency is set in the scan chain, it wastes the area of the electrical circuit. If the number of test points is not sufficient, the test coverage will not reach the required standard. Therefore, how to design the scan chain has become one of the issues of concern in this field.

SUMMARY OF THE INVENTION

One aspect of the present disclosure provides a scan chain designing method including operations of: obtaining a plurality of test points of a target circuit according to a gate-level netlist of the target circuit; determining a first number M and a second number N, wherein M and N are positive integers no greater than a number of the plurality of test points, and N differs from M; selecting M test points from the plurality of test points as a first set of test points and selecting N test points from the plurality of test points as a second set of test points according to a priority; obtaining a first test coverage and a first test pattern count according to the first set of test points, and obtaining a second test coverage and a second test pattern count according to the second set of test points; obtaining a predicted test coverage curve according to the first test coverage and the second test coverage; determining an optimum amount O according to the predicted test coverage curve, the first test pattern count and the second test pattern count, wherein O is a positive integer no greater than a number of the plurality of test points; and selecting O test points from the plurality of test points according to the priority and the optimum amount O to arrange a scan chain of the gate-level netlist according to the selected O test points.

Another aspect of the present disclosure provides a circuit testing method including operations of: determining X test points of a target circuit according to a gate-level netlist of a target circuit, wherein X is a positive integer; obtaining a ranking according to a priority of the X test points; obtaining a predicted test coverage curve corresponding to the X test points; determining an optimum amount O of test points according to the predicted test coverage curve, wherein a slope of the predicted test coverage curve corresponding to the optimum amount O of test points is no greater than a threshold, and O is a positive integer no greater than X; inserting a first to the O test points in the ranking into an initial scan chain of the gate-level netlist to generate a scan chain; and testing the target circuit according to the scan chain.

The scan chain design method and the circuit test method of the present disclosure rank the test points in the target circuit, obtain a corresponding test coverage curve according to the ranked priority, and then determine the optimal number of test points from the test coverage curve to set up the scan chain. The optimal number of test points obtained by the invention allows for sufficient test coverage, reasonable circuit area and test time when using the scan chain.

BRIEF DESCRIPTION OF THE DRAWINGS

Various aspects of the present application can best be understood upon reading the detailed description below and accompanying drawings. It should be noted that the various features in the drawings are not drawn to scale in accordance with standard practice in the art. In fact, the size of some features may be deliberately enlarged or reduced for the purpose of discussion.

DETAILED DESCRIPTION

Figure 1:
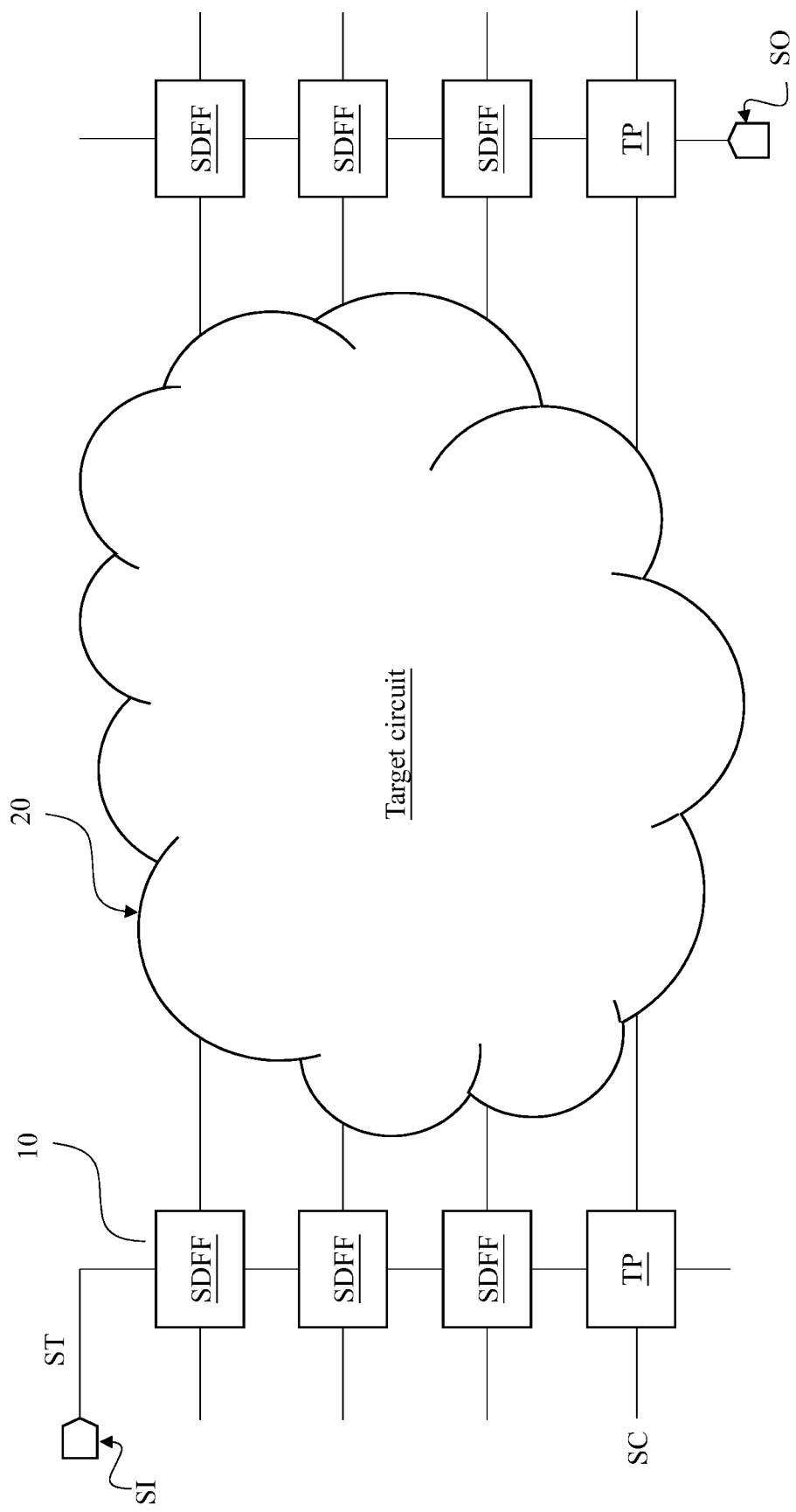
FIG. 1 is a schematic diagram illustrating a scan chain and a target circuit according to some embodiments of the present disclosure.

FIG. 1 is a schematic diagram illustrating a scan chain 10 and a target circuit 20 according to some embodiments of the present disclosure. In some embodiments, the target circuit 20 represents a logically functional part of a chip, and the scan chain 10 is the part of the chip used to test the target circuit 20 during a scan phase.

In some embodiments, the scan chain 10 includes a portion of nodes of the target circuit 20. Specifically, the scan chain 10 includes a plurality of triggers SDFF, wherein the plurality of triggers SDFF are nodes of the target circuit 20. The scan chain 10 uses the plurality of triggers SDFF to set the target circuit 20 and scan the status of the plurality of triggers SDFF so as to check the status of the target circuit 20. In some embodiments, the triggers SDFF are also referred to as timing component scanning triggers. The scan chain 10 further includes test points TP. The test points TP do not belong to the target circuit 20, which are configured to transmit and/or receive a signal into/from a node in the target circuit 20. The triggers SDFF and test points TP are connected to form the scan chain 10. In some embodiments, test points TP can be arranged at any position in the scan chain 10, the present disclosure is not limited to the sorting in the scan chain 10 shown in FIG. 1.

During the scan phase, a scan input terminal SI of the scan chain 10 is configured to receive a test signal ST and transmit the test signal ST into the scan chain 10 according to a clock. The triggers SDFF and test points TP are respectively connected to the target circuit 20 and configured to transmit the received test signal ST into the target circuit 20. A scan output terminal SO of the scan chain 10 is configured to output the test result. In some embodiments, the test signal ST is generated by an automatic test pattern generation (ATPG) tool.

In some embodiments, the test points TP are divided into control points and observation points. The control points are configured to control the signal transmitted to the target circuit 20, whereas the observation points are configured to receive the signal outputted by the target circuit 20. Specifically, the control points may receive a control signal SC independently of the test signal ST and are used to transmit the control signal SC to the target circuit 20, and the observation points are used to output the signal output by the target circuit 20 at the scan output SO as at least a part of the test result.

The greater the number of test points TP in the scan chain 10, the more nodes in the target circuit 20 can be tested and observed, i.e., the higher the test coverage. The higher the test coverage, the greater the testability of the chip. Generally, a chip needs to be scanned before it can be tape-out, and there is a minimum test coverage requirement to ensure that the chip functions properly. Therefore, the higher the test coverage is, the more reliable the test results are and the easier it is to meet the minimum test coverage limit.

Figure 2:
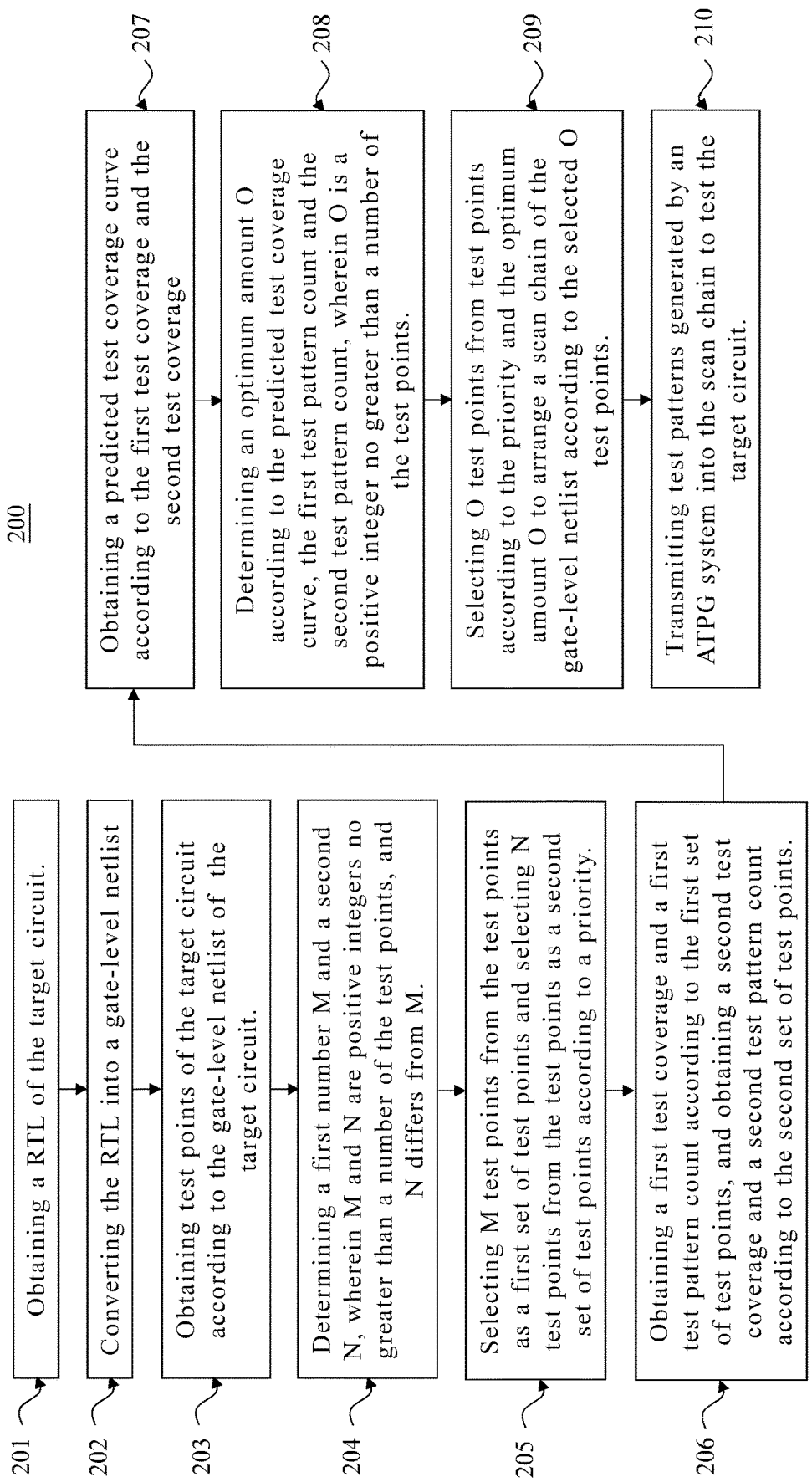
FIG. 2 is a flow chart illustrating a method for designing a scan chain and testing a target circuit according to the designed scan chain according to some embodiments of the present disclosure.

However, when the number of test points TP in the scan chain 10 increases, the area of the circuit occupied by the test points TP also increases. In addition, the number of test signal ST samples (also referred to as test patterns) increases with the complexity of the target circuit 20. When the number of test patterns (hereinafter referred to as test pattern count) increases, a time required to test the chip during the scan phase is thereby extended. Therefore, the present disclosure provides a method 200 (shown in FIG. 2) for achieving a trade-off between the test coverage, the area of the test point TP and the number of test patterns, so that the scanning chain 10 of the chip can meet the minimum test coverage, without taking up too much area of the test point TP, and without using too many test patterns. In some embodiments, at least part of the method 200 is performed by an electronic design automation (EDA) tool. For ease of understanding, the method 200 is discussed by referencing to the reference numerals in FIG. 1.

In the Step 201, a register transfer level (RTL) of the target circuit 20 is obtained. In the Step 202, the RTL is converted into a gate-level netlist of the target circuit 20. In some embodiments, an initial scan chain is obtained according to gate-level netlist, wherein when the initial scan chain is used to scan the target circuit 20, the test coverage is C0 (discussed in detail in FIG. 3 below) and the required test pattern count is P0 (discussed in detail in FIG. 3 below).

In the Step 203, X test points TP in the target circuit 20 are obtained according to the gate-level netlist of the target circuit 20, wherein X is a positive integer greater than 1. All the nodes in the gate-level netlist of the target circuit 20 are evaluated and a portion of the nodes are selected as the test points TP. In some embodiments, the selected nodes are nodes among the target circuit 20 that have a certain level of influence on the calculation results (and/or test results) generated by the target circuit 20. Specifically, when different values are inputted into the plurality of the selected nodes, the calculation results of the target circuit 20 change accordingly. Alternatively, when the signals received by the target circuit 20 are different, the plurality of the selected nodes receive different calculation results from the target circuit 20. In some embodiments, the plurality of test points TP are further ranked according to a priority, wherein the priority represents the level of influence of the plurality of nodes on the calculation results of the target circuit 20. When a node is the most influential one among the nodes, it is ranked as the first in the ranking of the plurality of test points TP.

In the Step 204, a number M and a number N are determined, wherein M and N are positive integers no greater than X, and M and N are different. In some embodiments, M and N are determined to be around ⅓ or ¼ of X. In the Step 205, M test points of the X test points TP are selected as the first set of test points, and N test points of the X test points TP are selected as the second set of test points, according to the priority. Specifically, because the test points TP are ranked according to the priority, the first set of test points include the first to the Mth test points TP of the ranking of the test points TP. Similarly, the second set of test points include the first to the Nth test points TPX of the ranking of the test points TP.

Figure 3:
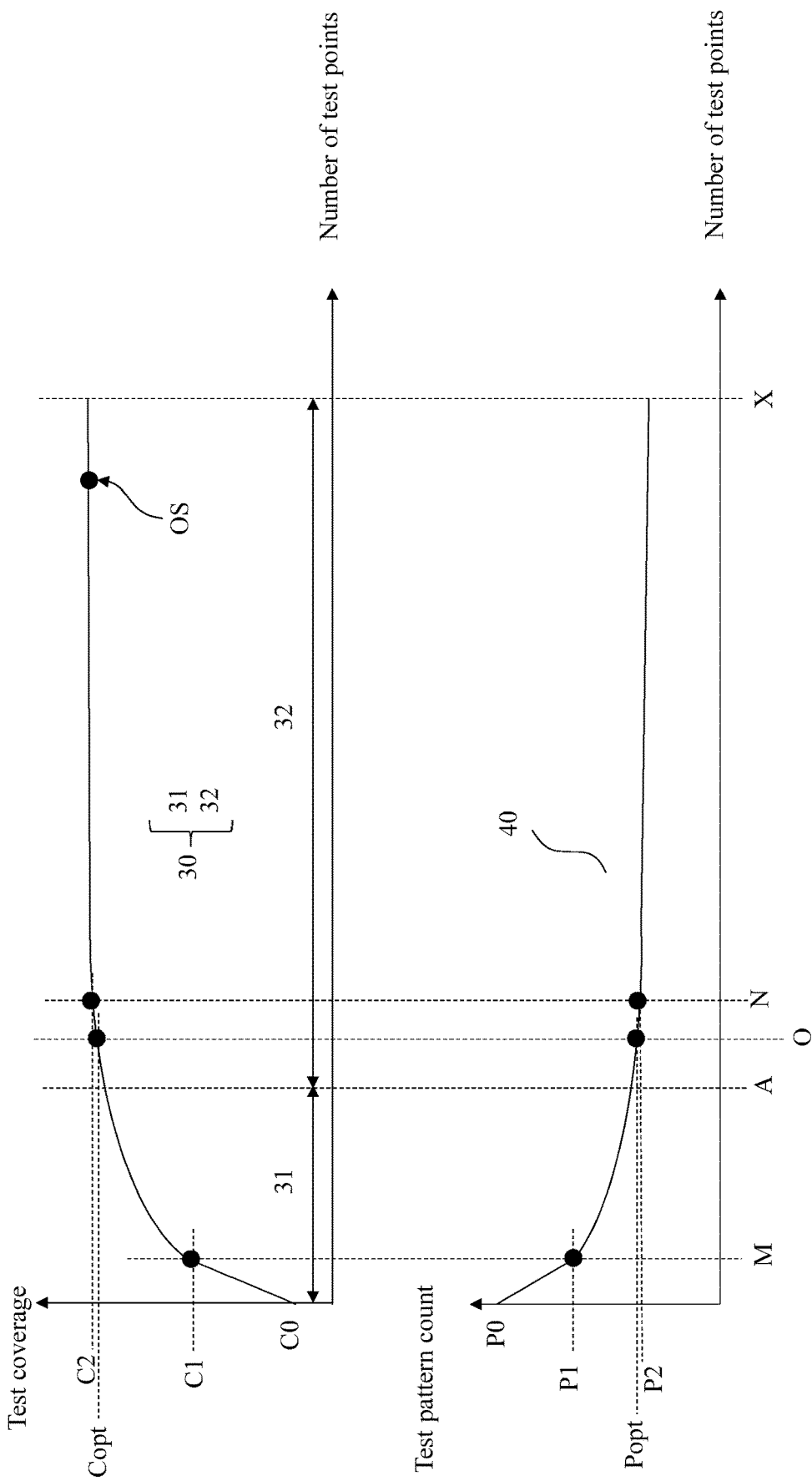
FIG. 3 is a schematic diagram illustrating a predicted test coverage curve and a test pattern count curve according to some embodiments of the present disclosure.

In the Step 206, a first test coverage C1 and a first test pattern count P1 are obtained according to the first set of test points, and a second test coverage C2 and a second test pattern count P2 are obtained according to the second set of test points. In the Step 207, a predicted test coverage curve 30 is obtained according to the first test coverage C1 and the second test coverage C2. Reference is also made to FIG. 3. FIG. 3 is a schematic diagram illustrating the predicted test coverage curve 30 and the test pattern count curve 40 according to some embodiments of the present disclosure. The predicted test coverage curve 30 and the test pattern count curve 40 are curves respectively representing the numbers of the predicted test coverage and the test pattern count corresponding to test points TP. As could be seen in FIG. 3, when the number of the test points TP increases, the test coverage increases and the test pattern count decreases.

The first set of test points and second set of test points are respectively inserted into an initial scan chain to generate a first scan chain and a second scan chain. In some embodiments, an ATPG tool calculates the requirements of the number of the test pattern according to an arrangement of the scan chain. Next, the ATPG tool is configured to generate P1 and P2 test patterns, respectively, and transmit the P1 and P2 test patterns into the first scan chain and the second scan chain, to obtain the first test coverage C1 and the second test coverage C2. Then, the first test coverage C1 and the second test coverage C2 are fitted to obtain the predicted test coverage curve 30, and the corresponding test pattern count curve 40 is obtained according to the predicted test coverage curve 30.

In some embodiments, the predicted test coverage curve 30 is obtained by using a polynomial equation and an exponential equation for fitting. More specifically, in the case where the number of the test points is no greater than A, the EDA tool uses a polynomial equation to fit a first part 31 of the predicted test coverage curve 30, and in the case where the number of the test points is greater than A and less than X, the EDA tool uses an exponential equation to fit a second part 32 of the predicted test coverage curve 30. For example, the predicted test coverage curve 30 can be expressed as equations (1) and (2).

$$y = a_1 x^2 + b_1 x + c_1; \text{ if } x \leq A. \tag{1}$$

$$y = a_2 \left(1 - e^{-\frac{x-b_2}{c_2}}\right); \text{ if } x > A. \tag{2}$$

Wherein, x is the number of test points; y is the test coverage; a1, a2, b1, b2, c1 and c2 are fitting constants. However, the present disclosure is not limited thereto, and various suitable fitting approaches are all within the contemplated scope of the present disclosure.

In the Step 208, an optimum amount O of the test points TP is determined according to the predicted test coverage curve 30, the first test pattern count P1 and the second test pattern count P2, wherein O is a positive integer no greater than X. As could be seen from the predicted test coverage curve 30, the test coverage does not change significantly when the number of the test points TP approaches X. Although increase in the number of test point TPs leads to a continuous increase in the test coverage, a slope of the test coverage gradually decreases. In addition, although a continuous increase in the number of test point TPs leads to a continuous decrease in the number of the test patterns, the decrement in the number of the test patterns gradually decreases. Therefore, in the range above the minimum limit of the test coverage, the optimal amount O is selected by evaluating the increment in the test coverage, the decrement in the test pattern number, and the area of the circuit occupied by increasing the number of the test points TP to achieve a trade-off, so as not to occupy too much area of the circuit or too long test time to obtain a greater test coverage. It is noted that in this embodiment, the number of the test patterns is positively related to the test time, and the test time is positively related to the test cost, so reducing the number of the test patterns means reducing the test time and test cost. For example, reducing the number of the test patterns by 20% can reduce the test time by roughly 20%, i.e., roughly reduce the test cost by 20%. The optimal test coverage Copt and the optimal test pattern Potp can be obtained when the amount of the test points TP is equal to O.

In some embodiments, the predicted test coverage curve 30 is a strictly increasing function, and the increment decreases as the number of the test points TP increases, so the slope of the predicted test coverage curve 30 also decreases as the number of the test points TP increases. The optimal amount O can be determined using the slope of the predicted test coverage curve 30. For example, finding the number of the test points where the slope of the predicted test coverage curve 30 is no less than a threshold, so as to determine the optimal amount O.

Figure 4:
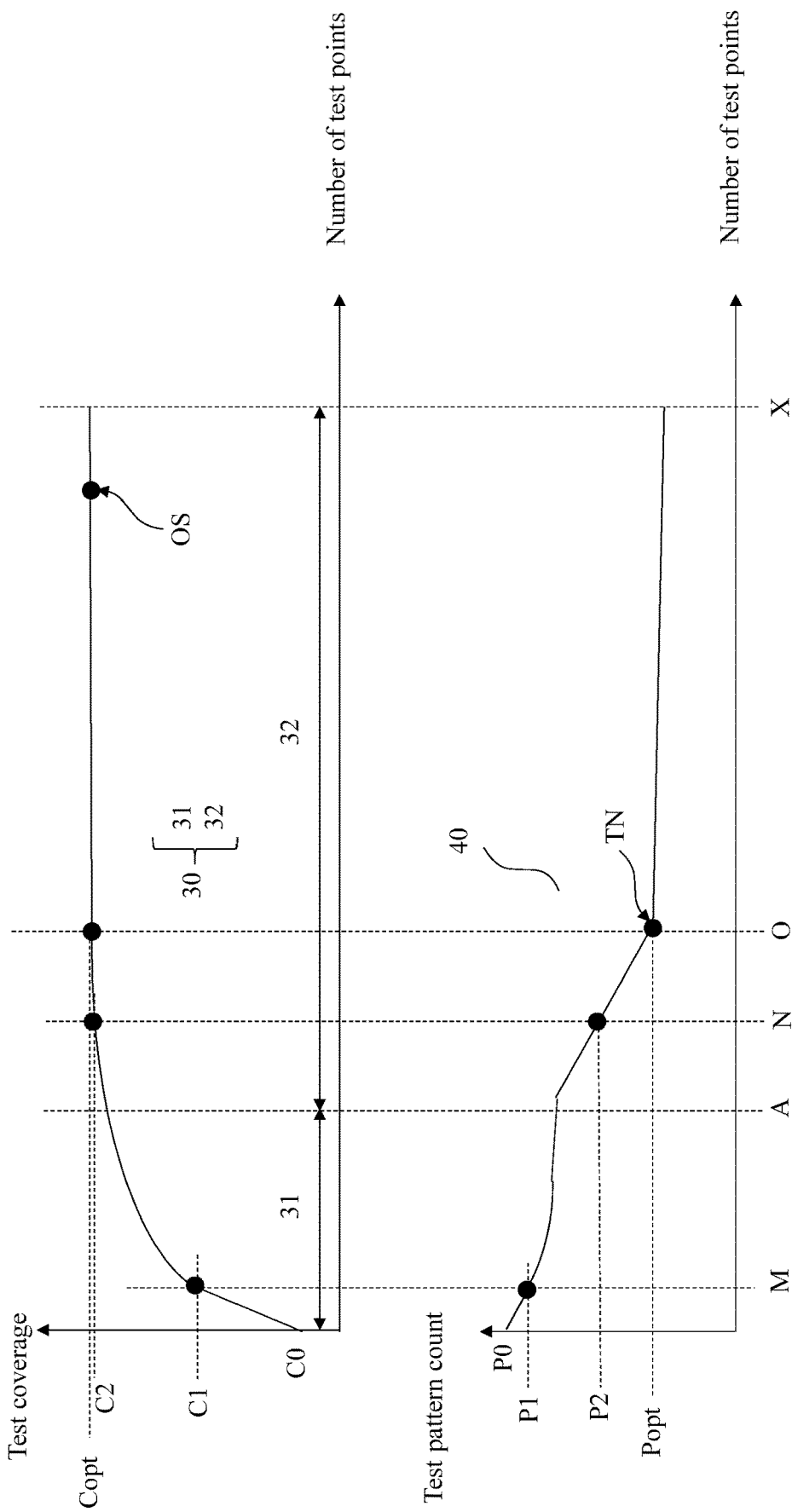
FIG. 4 and FIG. 5 are schematic diagrams illustrating a predicted test coverage curve and a test pattern count curve according to other embodiments of the present disclosure.
Figure 5:
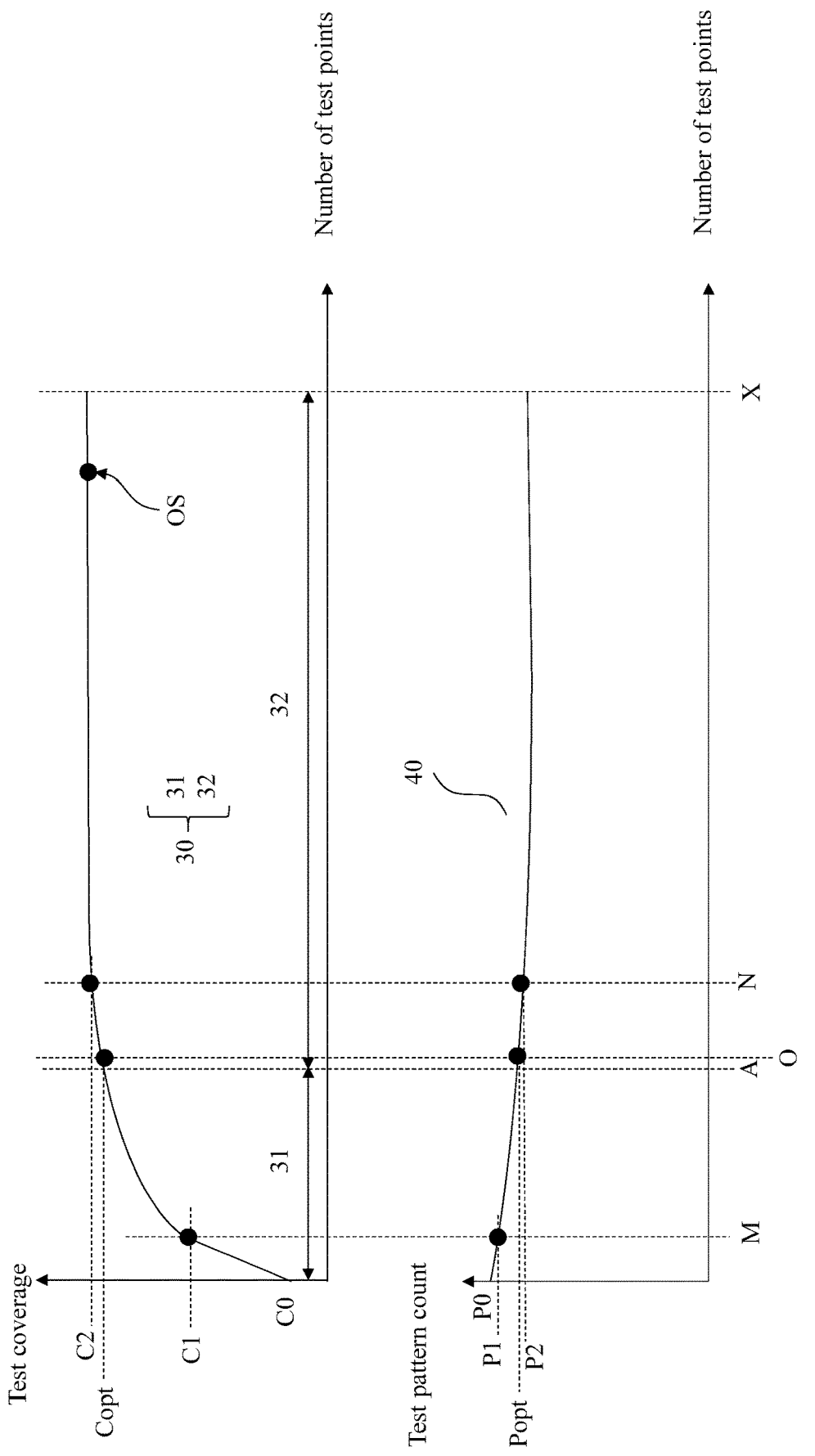

In other embodiments, the relationship between the predicted test coverage curve 30 and the test pattern count curve 40 differs from that in FIG. 3. Reference is made to FIG. 4 and FIG. 5. Compared to FIG. 3, the test pattern count curve 40 in FIG. 4 has a clear turn TN when the predicted test coverage curve 30 has entered the saturation phase (second part 32). In order to achieve an efficient reduction of the test pattern, the number of test points TP corresponding to the turn TN is determined as the optimal amount O. In contrast to FIG. 3, the test pattern count curve 40 in FIG. 5 decreases smoothly with the number of test points TP, so the optimal amount O is determined only according to the change of the predicted test coverage curve 30. The optimal amount O is therefore determined only by the change in the predicted test coverage curve 30.

In some conventional techniques, too many test points, such as the OS points shown in FIG. 3 to FIG. 5, are inserted in the scan chain to obtain a higher test coverage. By using the method of the present disclosure, the scan chain 10 can be set up using a better trade-offed status, which not only reduces the number of test points TP and test patterns, but also keeps the test coverage above a minimum.

In the Step 209, O test points TP in the X test points TP are selected according to the priority so as to arrange the scan chain of the gate-level netlist accordingly. The selected O test points TP are inserted into the initial scan chain, and O test points TP are physically arranged into the scan chain 10 on the chip correspondingly. In the Step 210, the ATPG system generates test patterns (having the number of Potp) and transmits the Potp test patterns into the scan chain 10 having the O test points so as to run a scan test on the target circuit 20.

The foregoing description briefly sets forth the features of some embodiments of the present application so that persons having ordinary skill in the art more fully understand the various aspects of the disclosure of the present application. It will be apparent to those having ordinary skill in the art that they can easily use the disclosure of the present application as a basis for designing or modifying other processes and structures to achieve the same purposes and/or benefits as the embodiments herein. It should be understood by those having ordinary skill in the art that these equivalent implementations still fall within the spirit and scope of the disclosure of the present application and that they may be subject to various variations, substitutions, and alterations without departing from the spirit and scope of the present disclosure.

What is claimed is:

1. A scan chain designing method, comprising:
    obtaining a plurality of test points of a target circuit according to a gate-level netlist of the target circuit;
    determining a first number M and a second number N, wherein M and N are positive integers no greater than a number of the plurality of test points, and N differs from M;
    selecting M test points from the plurality of test points as a first set of test points and selecting N test points from the plurality of test points as a second set of test points according to a priority;
    obtaining a first test coverage and a first test pattern count according to the first set of test points, and obtaining a second test coverage and a second test pattern count according to the second set of test points;
    obtaining a predicted test coverage curve according to the first test coverage and the second test coverage;
    determining an optimum amount O according to the predicted test coverage curve, the first test pattern count and the second test pattern count, wherein O is a positive integer no greater than a number of the plurality of test points; and
    selecting O test points from the plurality of test points according to the priority and the optimum amount O to arrange a scan chain of the gate-level netlist according to the selected O test points.

2. The scan chain designing method of claim 1, further comprising:
    obtaining a register transfer level (RTL) of the target circuit; and
    converting the RTL into the gate-level netlist.

3. The scan chain designing method of claim 1, further comprising:
    transmitting a plurality of test patterns generated by an automatic test pattern generation (ATPG) system into the scan chain to test the target circuit.

4. The scan chain designing method of claim 1, wherein the gate-level netlist corresponds to an initial scan chain, wherein in the step of selecting O test points from the plurality of test points according to the priority and the optimum amount to arrange the scan chain of the gate-level netlist according to the selected O test points, the O test points are inserted into the initial scan chain to arrange the scan chain.

5. The scan chain designing method of claim 4, wherein the step of obtaining the predicted test coverage curve according to the first test coverage and the second test coverage comprises:

inserting a first to an Nth test points in the priority into the initial scan chain to generate a first scan chain;

inserting the first to an Mth test points in the priority into the initial scan chain to generate a second scan chain; and loading a plurality of test patterns generated by an ATPG system into the first scan chain and the second scan chain to respectively generate the first test coverage and the second test coverage.

6. The scan chain designing method of claim 5, wherein the step of obtaining the predicted test coverage curve according to the first test coverage and the second test coverage further comprises:

fitting the predicted test coverage curve according to the first test coverage and the second test coverage.

7. The scan chain designing method of claim 6, wherein the step of fitting the predicted test coverage curve according to the first test coverage and the second test coverage comprises:

fitting a first part of the predicted test coverage curve according to a polynomial equation; and fitting a second part of the predicted test coverage curve according to an exponential equation.

8. The scan chain designing method of claim 7, wherein the step of fitting the predicted test coverage curve according to the first test coverage and the second test coverage further comprises:

combining the first part and the second part into the predicted test coverage curve.

9. The scan chain designing method of claim 8, wherein the step of obtaining the predicted test coverage curve according to the first test coverage and the second test coverage comprises:

obtaining a test pattern count curve according to the predicted test coverage curve.

10. The scan chain designing method of claim 9, wherein when the predicted test coverage curve increases, the test pattern count curve decreases.

11. A circuit testing method, comprising:

determining X test points of a target circuit according to a gate-level netlist of a target circuit, wherein X is a positive integer;

obtaining a ranking according to a priority of the X test points;

obtaining a predicted test coverage curve corresponding to the X test points;

determining an optimum amount O of test points according to the predicted test coverage curve, wherein a slope of the predicted test coverage curve corresponding to the optimum amount O of test points is no greater than a threshold, and O is a positive integer no greater than X;

inserting a first to the O test points in the ranking into an initial scan chain of the gate-level netlist to generate a scan chain; and testing the target circuit according to the scan chain.

12. The circuit testing method of claim 11, further comprising:

obtaining an RTL of the target circuit; and converting the RTL into the gate-level netlist.

13. The circuit testing method of claim 11, wherein the step of testing the target circuit according to the scan chain comprises:

transmitting a plurality of test patterns generated by an ATPG system into the scan chain; and obtaining a plurality of test results generated by the scan chain according to the plurality of test pattern.

14. The circuit testing method of claim 11, wherein the step of obtaining the X test points corresponding to the predicted test coverage curve comprises:

inserting a first to an Nth test points in the ranking into the initial scan chain to generate a first scan chain;

inserting the first to an Mth test points in the ranking into the initial scan chain to generate a second scan chain; and loading a plurality of test patterns generated by an ATPG system into the first scan chain and the second scan chain to respectively generate a first test coverage and a second test coverage.

15. The circuit testing method of claim 14, wherein M and N are positive integers less than X, and M and N are different.

16. The circuit testing method of claim 14, wherein the step of obtaining the X test points corresponding to the predicted test coverage curve further comprises:

fitting the predicted test coverage curve according to the first test coverage and the second test coverage.

17. The circuit testing method of claim 16, wherein the step of fitting the predicted test coverage curve according to the first test coverage and the second test coverage comprises:

fitting a first part of the predicted test coverage curve according to a polynomial equation; and fitting a second part of the predicted test coverage curve according to an exponential equation.

18. The circuit testing method of claim 17, wherein the step of fitting the predicted test coverage curve according to the first test coverage and the second test coverage further comprises:

combining the first part and the second part into the predicted test coverage curve.

19. The circuit testing method of claim 11, wherein the step of obtaining the predicted test coverage curve corresponding to the X test points comprises:

obtaining a test pattern count curve according to the predicted test coverage curve.

20. The circuit testing method of claim 19, wherein when the predicted test coverage curve increases, the test pattern count curve decreases.

* * * * *